(12) United States Patent
Yamada et al.

(10) Patent No.: US 7,441,166 B2
(45) Date of Patent: Oct. 21, 2008

(54) TESTING APPARATUS AND TESTING METHOD

(75) Inventors: Masuhiro Yamada, Tokyo (JP); Kazuhiko Sato, Tokyo (JP); Toshimi Ohsawa, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 11/515,350

(22) Filed: Sep. 1, 2006

(65) Prior Publication Data

US 2007/0067685 A1 Mar. 22, 2007

Related U.S. Application Data

(63) Continuation of application No. PCT/JP2005/005171, filed on Mar. 22, 2005.

(30) Foreign Application Priority Data

Mar. 24, 2004 (JP) .............................. 2004-087924

(51) Int. Cl.
*G11C 29/00* (2006.01)
*G01R 31/28* (2006.01)
*G06F 11/00* (2006.01)

(52) U.S. Cl. .................. 714/718; 714/736; 714/738

(58) Field of Classification Search ................ 714/718, 714/719, 724, 736, 738, 819; 365/200, 201
See application file for complete search history.

(56) References Cited

U.S. PATENT DOCUMENTS 5,070,297 A * 12/1991 Kwon et al. ............... 324/754
5,610,925 A * 3/1997 Takahashi ................... 714/724
5,790,559 A * 8/1998 Sato .......................... 714/720
7,036,053 B2 * 4/2006 Zumkehr et al. ........... 714/709

(Continued)

FOREIGN PATENT DOCUMENTS

WO  WO-97/04328  2/1997

(Continued)

OTHER PUBLICATIONS

International Search Report issued in International Application No. PCT/JP2005/005171 mailed on Jun. 28, 2005 and English translation thereof, 4 pages.

*Primary Examiner*—Phung M Chung
(74) *Attorney, Agent, or Firm*—Osha · Liang LLP

(57) ABSTRACT

There is provided a testing apparatus including: a pattern generator that generates an address signal and a data signal to be supplied to a plurality of memories under test and an expectation signal; a plurality of logic comparators that generate fail data when an output signal output from the plurality of memories under test and the expectation signal are not identical with each other; a plurality of fail memories that store the fail data generated from the plurality of logic comparators; a plurality of memory controllers that generate bad address information showing a bad address in the memory under test based on the fail data stored on the plurality of fail memories; a plurality of universal buffer memories that store the bad address information generated from the plurality of memory controllers; and a plurality of bad information writing sections that concurrently write bad information into the bad address in the plurality of memories under test, which is shown by the bad address information stored on the plurality of universal buffer memories.

15 Claims, 9 Drawing Sheets

U.S. PATENT DOCUMENTS 7,137,055 B2 * 11/2006 Hirano et al. ............... 714/738
2007/0162826 A1 * 7/2007 Major et al. ................. 714/763

FOREIGN PATENT DOCUMENTS

| WO | WO-00/52488 | 9/2000 |
| WO | WO-02/33708 | 4/2002 |
| WO | WO-03/052767 | 6/2003 |

* cited by examiner

|  | I/O 0 | I/O 1 | I/O 2 | I/O 3 | I/O 4 | I/O 5 | I/O 6 | I/O 7 | |
|---|---|---|---|---|---|---|---|---|---|
| 1st Cycle | A0 | A1 | A2 | A3 | A4 | A5 | A6 | A7 | COLUMN ADDRESS |
| 2st Cycle | A8 | A9 | A10 | A11 | L | L | L | L | COLUMN ADDRESS |
| 3st Cycle | A12 | A13 | A14 | A15 | A16 | A17 | A18 | A19 | ROW ADDRESS |
| 4st Cycle | A20 | A21 | A22 | A23 | A24 | A25 | A26 | A27 | ROW ADDRESS |
| 5st Cycle | A28 | L | L | L | L | L | L | L | ROW ADDRESS |

TESTING APPARATUS AND TESTING METHOD

CROSS REFERENCE TO RELATED APPLICATION

This is a continuation application of PCT/JP2005/005171 filed on Mar. 22, 2005 which claims priority from a Japanese Patent Application NO. 2004-87924 filed on Mar. 24, 2004, the contents of which are incorporated herein by reference.

BACKGROUND

1. Field of the Invention

The present invention relates to a testing apparatus and a testing method. More particularly, the present invention relates to a testing apparatus and a testing method for testing a memory under test.

2. Related Art

FIG. 7 is a view showing a configuration of a NAND type flash memory. A memory cell array of the NAND type flash memory has a structure significantly divided into three areas. The first area is a main area used as a data storing area for storing data, the second area is an extended area for storing bad information to distinguish whether the main area is normal or not, and the third area is a special area for storing manufacturing information, ID management information, and bad information such as map information of a bad block. Then, the NAND type flash memory includes a plurality of block areas respectively having a plurality of page areas respectively including a main area and an extended area.

When a partially bad cell exists in a specific block area by adopting the structure divided as described above, since a bad code that is an example of bad information showing that this block area is bad is recorded in an extended area of the block area, it can be controlled so that a user does not use this block area. Moreover, since an error correction code for ECC correction is recorded and used in the extended area of the block area, it can be treated as a non-defective unit. As a result, a manufacturing yield can be improved and a memory unit price can be reduced. However, in order to test and relieve a NAND type flash memory with a bad cell, a complicated test item is required and a testing time becomes increased. Therefore, a development of a testing apparatus for efficiently testing and relieving a NAND type flash memory has been progressed.

FIG. 8 is a view showing a configuration of a testing apparatus 800 according to a conventional art. The testing apparatus 800 includes a pattern generator 802, a main waveform shaper 804, a plurality of individual test units 806, an interface 808, a CPU 810, and a tester bus 812. Each of the plurality of individual test units 806 has a universal buffer memory 822, an internal bus 823, a block fail memory 824, a bad block counter 826, a sub waveform shaper 832, a logic comparator 834, a multiplexer 836, a driver 838, and a level comparator 840, and is provided corresponding to each of a plurality of memories under test (hereinafter, referred to as "DUT") 850.

The pattern generator 802 generates an address signal and a data signal to be supplied to the plurality of DUTs 850, and supplies the generated signals to the main waveform shaper 804. Moreover, the pattern generator 802 supplies the generated address signal to a plurality of block fail memories 824. Moreover, the pattern generator 802 generates an expectation signal to be output from the DUT 850 according to the address signal and the data signal, and supplies the generated signal to the logic comparator 834. The main waveform shaper 804 shapes the address signal and the data signal generated from the pattern generator 802 into a waveform with a format required for a test of the DUT 850, and supplies the shaped waveform to the DUT 850 via the multiplexer 836 and the driver 838.

The logic comparator 834 compares an output signal from the DUT 850 converted into a binary value by the level comparator 840 and an expectation signal supplied from the pattern generator 802 to generate fail data and supplies the data to the block fail memory 824 when the output signal and the expectation signal are not identical with each other. The block fail memory 824 stores the fail data generated from the logic comparator 834 in association with an address shown by the address signal supplied from the pattern generator 802. The bad block counter 826 counts the fail data generated from the logic comparator 834 to count the number of bad block areas in the DUT 850.

The CPU 810 refers to the block fail memory 824 via the interface 808, reads the fail data stored on the block fail memory 824, and generates bad address information showing block addresses of the bad block areas in the DUT 850 based on the read fail data. Then, the CPU 810 supplies the bad address information to the universal buffer memory 822 via the interface 808.

The universal buffer memory 822 stores the bad address information generated from the CPU 810. Then, the universal buffer memory 822 sequentially supplies the bad address information showing the block addresses to the sub waveform shaper 832. The sub waveform shaper 832 generates an address signal to be supplied to the DUT 850 and supplies the generated signal to the DUT 850 via the multiplexer 836 and the driver 838 based on a block address shown by the bad address information supplied from the universal buffer memory 822, in order to write bad information into an extended area in a block area shown by the bad address information stored on the universal buffer memory 822.

FIG. 9 is a schematic view showing a data transfer process in the testing apparatus 800 according to a conventional art. The CPU 810 performs a data transfer from/to the universal buffer memory 822 and the block fail memory 824 via the interface 808. In addition, since this data transfer is performed via the tester bus 812, it cannot be performed during a test for the DUT 850 and it should be performed at a time after a test termination for the DUT 850. Moreover, the CPU 810 sequentially generates bad address information respectively corresponding to fail data stored on a plurality of universal buffer memories 822 by a serial process. Therefore, when a number of DUTs 850 are simultaneously tested, since an overhead of data transfers is also generated to cause the increase of a transfer time and a waiting time for use in generating bad address information by the CPU 810 is required, a throughput for the test cannot be improved.

SUMMARY

Therefore, it is an object of some aspects of the present invention to provide a testing apparatus and a testing method that can solve the foregoing problems. The above and other objects can be achieved by combinations described in the independent claims. The dependent claims define further advantageous and exemplary combinations of the present invention.

That is, according to the first aspect of the present invention, there is provided a testing apparatus that concurrently tests a plurality of memories under test. The testing apparatus includes: a pattern generator that generates an address signal and a data signal to be supplied to the plurality of memories under test and an expectation signal to be output from the memory under test according to the address signal and the data signal; a plurality of logic comparators that are provided corresponding to each of the plurality of memories under test and compare an output signal output from the plurality of memories under test according to the address signal and the data signal and the expectation signal to generate fail data when the output signal and the expectation signal are not identical with each other; a plurality of fail memories that are provided corresponding to each of the plurality of memories under test and store the fail data generated from the plurality of logic comparators in association with an address shown by the address signal; a plurality of memory controllers that are provided corresponding to each of the plurality of memories under test and generate bad address information showing a bad address in the memory under test based on the fail data stored on the plurality of fail memories; a plurality of universal buffer memories that are provided corresponding to each of the plurality of memories under test and store the bad address information generated from the plurality of memory controllers; and a plurality of bad information writing sections that are provided corresponding to each of the plurality of memories under test and concurrently write a first bad information into the bad address in the plurality of memories under test, which is shown by the bad address information stored on the plurality of universal buffer memories.

The testing apparatus may further include: a plurality of first buses that respectively connect the plurality of fail memories to the plurality of memory controllers; and a plurality of second buses that respectively connect the plurality of memory controllers to the plurality of universal buffer memories.

The memory controller may generate the bad address information with a format peculiar to the memory under test and supplies the generated information to the universal buffer memory.

The memory controller may operate based on a program loaded according to a type of the memory under test in order to generate the bad address information with the format peculiar to the memory under test.

The memory under test may include a plurality of block areas respectively having a plurality of page areas respectively including a main area storing data and an extended area storing the first bad information, the fail memory may store the fail data on each of the block areas in the memory under test, the memory controller may generate the bad address information showing a block address of the bad block area in the memory under test with reference to the fail memory, the universal buffer memory may store the bad address information generated from the memory controller, and the bad information writing section may write the first bad information into the extended area in the block area shown by the bad address information stored on the universal buffer memory.

The pattern generator may generate a page address signal showing the page area to supply the generated signal to the plurality of bad information writing sections, and the plurality of bad information writing sections may write the first bad information into the extended area in the page area shown by the page address signal generated from the pattern generator, the page area being included in the block area shown by the bad address information stored on the plurality of universal buffer memories provided corresponding to each of the plurality of memories under test.

The memory controller may include: a data reading section that reads data stored on a predetermined address of the fail memory; a fail judging section that judges whether the fail data are included in the data read from the data reading section or not; and a bad address information generating section that generates the bad address information when the fail judging section judges that the fail data are included in the data read from the data reading section.

The plurality of memory controllers may generate a second bad information with a format peculiar to the memory under test based on the fail data stored on the plurality of fail memories, the plurality of universal buffer memories may store the second bad information generated from the plurality of memory controllers, and the plurality of bad information writing sections may write the second bad information stored on the plurality of universal buffer memories into the plurality of memories under test.

The memory controller may operate based on a program loaded according to a type of the memory under test in order to generate the second bad information with the format peculiar to the memory under test.

The testing apparatus may further include: a plurality of first fail information memories that are provided corresponding to each of the plurality of memories under test and store the second bad information generated from the plurality of memory controllers; a plurality of second fail information memories that are provided corresponding to each of the plurality of memories under test and store the second bad information read from the plurality of memories under test; and a quality deciding section that compares the second bad information stored on the first fail information memory and the second bad information stored on the second fail information memory to decide the good or bad of the plurality of memories under test.

The testing apparatus may further include: a plurality of first buses that respectively connect the plurality of fail memories and the plurality of first fail information memories to the plurality of memory controllers; and a plurality of second buses that respectively connect the plurality of memory controllers to the plurality of universal buffer memories.

The memory under test may include a plurality of main areas storing data and a special area storing the second bad information, and the bad information writing section may write the second bad information into the special area included in the memory under test.

According to the second aspect of the present invention, there is provided a testing apparatus that concurrently tests a plurality of memories under test. The testing apparatus includes: a pattern generator that generates an address signal and a data signal to be supplied to the plurality of memories under test and an expectation signal to be output from the memory under test according to the address signal and the data signal; a plurality of logic comparators that are provided corresponding to each of the plurality of memories under test and compare an output signal output from the plurality of memories under test according to the address signal and the data signal and the expectation signal to generate fail data when the output signal and the expectation signal are not identical with each other; a plurality of fail memories that are provided corresponding to each of the plurality of memories under test and store the fail data generated from the plurality of logic comparators in association with an address shown by the address signal; a plurality of memory controllers that are provided corresponding to each of the plurality of memories under test and generate bad information with a format peculiar to the memory under test based on the fail data stored on the plurality of fail memories; a plurality of universal buffer memories that are provided corresponding to each of the plurality of memories under test and store the bad information generated from the plurality of memory controllers; and a plurality of bad information writing sections that are provided corresponding to each of the plurality of memories under test and write the bad information stored on the plurality of universal buffer memories into the plurality of memories under test.

According to the third aspect of the present invention, there is provided a testing method for concurrently testing a plurality of memories under test. The testing method includes: generating an address signal and a data signal to be supplied to the plurality of memories under test and an expectation signal to be output from the memory under test according to the address signal and the data signal; comparing an output signal output from the plurality of memories under test according to the address signal and the data signal and the expectation signal to generate fail data when the output signal and the expectation signal are not identical with each other by means of a plurality of logic comparators provided corresponding to each of the plurality of memories under test; storing the fail data in association with an address shown by the address signal on a plurality of fail memories provided corresponding to each of the plurality of memories under test; generating bad address information showing a bad address in the memory under test based on the fail data stored on the plurality of fail memories by means of a plurality of memory controllers provided corresponding to each of the plurality of memories under test; storing the bad address information generated from the plurality of memory controllers on a plurality of universal buffer memories provided corresponding to each of the plurality of memories under test; and concurrently writing a first bad information into the bad address in the plurality of memories under test, which is shown by the bad address information stored on the plurality of universal buffer memories by means of a plurality of bad information writing sections provided corresponding to each of the plurality of memories under test.

According to the fourth aspect of the present invention, there is provided a testing method for concurrently testing a plurality of memories under test. The testing method includes: generating an address signal and a data signal to be supplied to the plurality of memories under test and an expectation signal to be output from the memory under test according to the address signal and the data signal; comparing an output signal output from the plurality of memories under test according to the address signal and the data signal and the expectation signal to generate fail data when the output signal and the expectation signal are not identical with each other by means of a plurality of logic comparators provided corresponding to each of the plurality of memories under test; storing the fail data generated from the plurality of logic comparators in association with an address shown by the address signal by means of a plurality of fail memories provided corresponding to each of the plurality of memories under test; generating bad information with a format peculiar to the memory under test based on the fail data stored on the plurality of fail memories by means of a plurality of memory controllers provided corresponding to each of the plurality of memories under test; storing the bad information generated from the plurality of memory controllers by means of a plurality of universal buffer memories provided corresponding to each of the plurality of memories under test; and writing the bad information stored on the plurality of universal buffer memories into the plurality of memories under test by means of a plurality of bad information writing sections provided corresponding to each of the plurality of memories under test.

The summary does not necessarily describe all necessary features of the present invention. The present invention may also be a sub-combination of the features described above.

DESCRIPTION OF EXEMPLARY EMBODIMENTS

The embodiments of the invention will now be described based on the preferred embodiments, which do not intend to limit the scope of the present invention, but just exemplify the invention. All of the features and the combinations thereof described in the embodiment are not necessarily essential to the invention.

Figure 1:
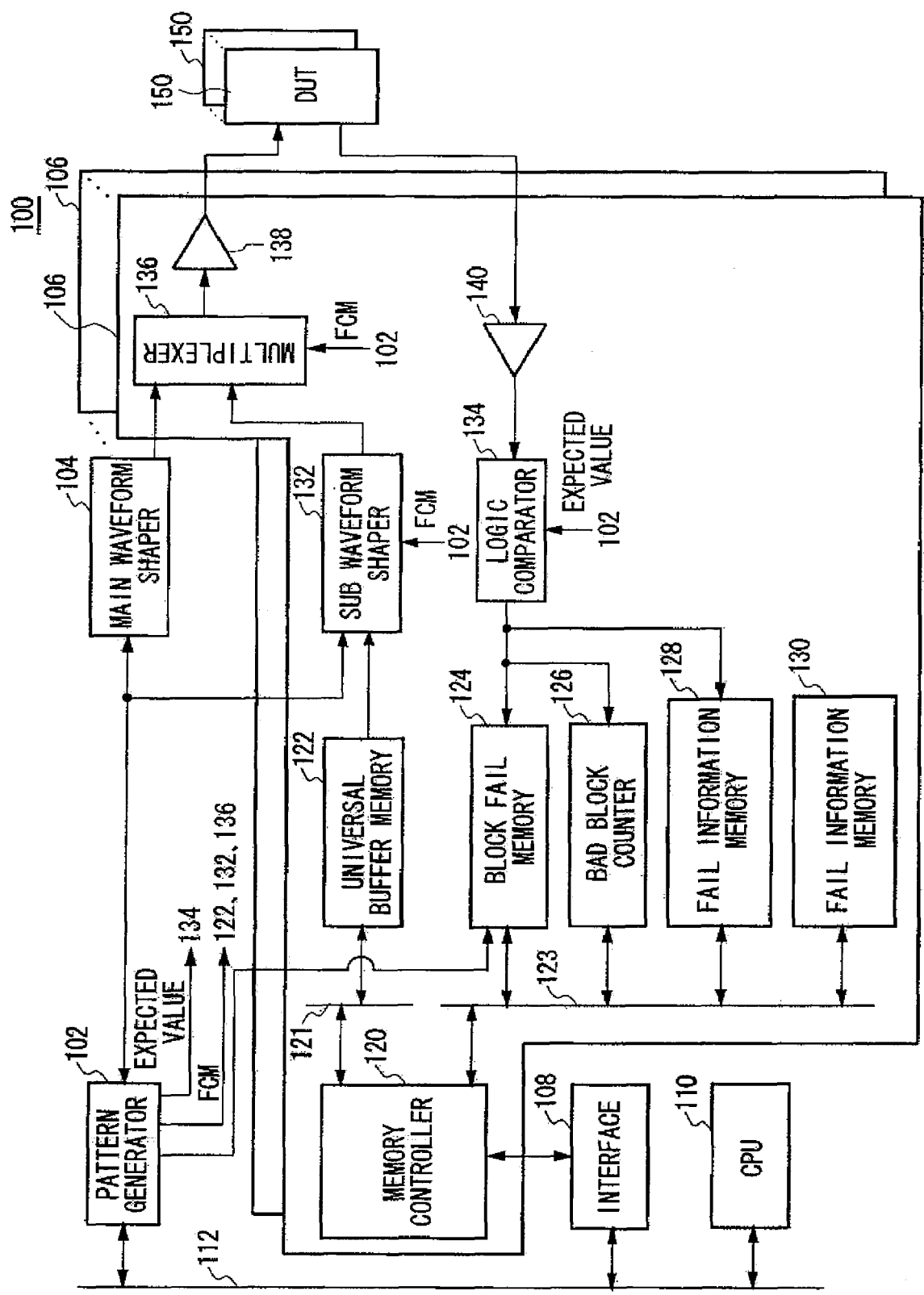
FIG. 1 is a view exemplary showing a configuration of a testing apparatus 100.

FIG. 1 is a view exemplary showing a configuration of a testing apparatus 100 according to an embodiment of the present invention. The testing apparatus 100 includes a pattern generator 102, a main waveform shaper 104, a plurality of individual test units 106, an interface 108, a CPU 110, and a tester bus 112. Each of the plurality of individual test units 106 has a memory controller 120, an external bus 121, a universal buffer memory 122, an internal bus 123, a block fail memory 124, a bad block counter 126, a fail information memory 128, a fail information memory 130, a sub waveform shaper 132, a logic comparator 134, a multiplexer 136, a driver 138, and a level comparator 140, and is provided corresponding to each of a plurality of DUTs 150. The DUT 150 is, e.g., a NAND type flash memory.

The testing apparatus 100 concurrently tests each of the plurality of DUTs 150 by means of each of the plurality of individual test units 106, and concurrently writes bad information in each of the plurality of DUTs 150 based on a test result of each of the plurality of DUTs 150. Specifically, the testing apparatus 100 tests whether a bad cell exists for each of block areas in a NAND type flash memory that is the DUT 150, makes bad address information showing a block area in which a bad cell exists, writes bad information in an extended area of a block area shown by this bad address information, and writes bad address information in a special area in the DUT 150. Since the memory controller 120 provided corresponding to each of the plurality of DUTs 150 in the testing apparatus 100 can concurrently make bad address information for each of the plurality of DUTs 150 to reduce a time required for generating bad information or bad address information, it is possible to improve a throughput for a test. Hereinafter, it will be described about an operation of each component included in the testing apparatus 100.

The tester bus 112 is connected to the pattern generator 102, the interface 108, and the CPU 110 to relay communication. The CPU 110 controls the pattern generator 102 and the interface 108 via the tester bus 112 and performs various types of processes based on requests from the pattern generator 102 and the interface 108. The interface 108 connects the memory controller 120 and the tester bus 112 and controls communication between the memory controller 120 and the CPU 110.

The pattern generator 102 generates an address signal and a data signal to be supplied to the plurality of DUTs 150, and supplies these signals to the main waveform shaper 104. Moreover, the pattern generator 102 supplies the generated address signal to the plurality of block fail memories 124. Moreover, the pattern generator 102 generates an expectation signal to be output from the DUT 150 according to the address signal and the data signal, and supplies the expectation signal to the logic comparator 134. Moreover, the pattern generator 102 supplies a control signal (hereinafter, referred to as a "FCM" signal) to control operations of the plurality of universal buffer memories 122, the plurality of sub waveform shapers 132, and the plurality of multiplexers 136. Moreover, when the pattern generator 102 writes bad information in the DUT 150, the pattern generator 102 generates a page address signal showing a page area of the DUT 150 to supply the page address signal along with the bad information to the plurality of sub waveform shapers 132. The main waveform shaper 104 shapes the address signal and the data signal generated from the pattern generator 102 into a waveform with a format required for a test of the DUT 150, and supplies the shaped signals to the multiplexer 136 each included in the plurality of individual test units 106.

The multiplexer 136 selects the address signal and the data signal supplied from the main waveform shaper 104 based on the FCM signal supplied from the pattern generator 102. Then, the driver 138 applies the address signal and the data signal selected by the multiplexer 136 to the DUT 150.

The level comparator 140 compares the output signal output from the DUT 150 according to the address signal and the data signal with a predetermined threshold voltage, in order to convert the output signal into a binary output signal and supply the binary signal to the logic comparator 134. The logic comparator 134 compares the output signal supplied from the level comparator 140 and the expectation signal supplied from the pattern generator 102, and then generates fail data when the output signal and the expectation signal are not identical with each other and supplies the data to the block fail memory 124. The block fail memory 124 stores the fail data generated from the logic comparator 134 in association with an address shown by the address signal supplied from the pattern generator 102. In the present embodiment, the pattern generator 102 generates an address signal showing a block address that is an address of a block area of the DUT 150, and the block fail memory 124 stores fail data for each block area of the DUT 150. Moreover, the bad block counter 126 counts the number of bad block areas of the DUT 150 by counting the fail data generated from the logic comparator 134. The number of fail data counted by the bad block counter 126 is used for failure analysis, quality decision, or the like of the DUT 150, for example, by software.

The external bus 121 connects the universal buffer memory 122 and the memory controller 120 to relay communication. Moreover, the internal bus 123 connects the block fail memory 124, the bad block counter 126, the fail information memory 128, and the fail information memory 130 to the memory controller 120, in order to relay communication.

The memory controller 120 refers to the block fail memory 124 via the internal bus 123, reads the fail data stored on the block fail memory 124, and generates bad address information showing a block address of a bad block area included in the DUT 150 based on the read fail data. Then, the memory controller 120 supplies the bad address information to the universal buffer memory 122 via the external bus 121. The memory controller 120 generates bad address information with a format peculiar to the DUT 150, and supplies the information to the universal buffer memory 122. In addition, the memory controller 120 operates based on a program loaded according to the type of the DUT 150, in order to generate the bad address information with the format peculiar to the DUT 150.

The universal buffer memory 122 stores the bad address information generated from the memory controller 120. Then, the universal buffer memory 122 sequentially supplies bad address information showing a block address to the sub waveform shaper 132. The sub waveform shaper 132 generates an address signal and a data signal with a format peculiar to the DUT 150 based on a block address shown by the bad address information supplied from the universal buffer memory 122 and a page address and bad information shown by the page address signal supplied from the pattern generator 102 based on the FCM signal supplied from the pattern generator 102. The multiplexer 136 selects the address signal and the data signal supplied from the sub waveform shaper 132 based on the FCM signal supplied from the pattern generator 102. Then, the driver 138 writes bad information in an extended area of a page area shown by the page address signal supplied from the pattern generator 102, in which the page area is included in a block area shown by the bad address information stored on the universal buffer memory 122, by applying the address signal and the data signal selected by the multiplexer 136 to the DUT 150. The sub waveform shaper 132 and the driver 138 are an example of a bad information writing section of the present invention, and write bad information in an extended area of the DUT 150 in a method of writing a format according to the type of the DUT 150.

Moreover, the memory controller 120 reads fail data stored on the block fail memory 124 via the internal bus 123, and generates bad information with a format peculiar to the DUT 150 based on the read fail data. Bad information is information including a plurality of bad address information indicative of block addresses of a bad block area included in the DUT 150. Then, the memory controller 120 supplies bad information to the universal buffer memory 122 via the external bus 121. Moreover, the memory controller 120 supplies bad information to the fail information memory 130 via the internal bus 123. In addition, the memory controller 120 operates based on a program loaded according to the type of the DUT 150, in order to generate bad information with a format peculiar to the DUT 150.

The universal buffer memory 122 stores the bad information generated from the memory controller 120. Then, the universal buffer memory 122 sequentially supplies the bad information to the bad waveform shaper 132. The sub waveform shaper 132 generates an address signal and a data signal with a format peculiar to the DUT 150 based on the bad information supplied from the universal buffer memory 122 and an address signal showing an address of a special area supplied from the pattern generator 102 based on the FCM signal supplied from the pattern generator 102. The multiplexer 136 selects the address signal and the data signal supplied from the sub waveform shaper 132 based on the FCM signal supplied from the pattern generator 102. Then, the driver 138 writes the bad information stored on the universal buffer memory 122 in the special area of the DUT 150 shown by the address signal supplied from the pattern generator 102 by applying the address signal and the data signal selected by the multiplexer 136 to the DUT 150. The sub waveform shaper 132 and the driver 138 are an example of a bad information writing section of the present invention, and write bad information in the special area of the DUT 150 in a method of writing a format according to the type of the DUT 150.

The fail information memory 128 stores the bad information read from the special area of the DUT 150 by means of the level comparator 140. Moreover, the fail information memory 130 stores the bad information generated from the memory controller 120 via the internal bus 123. Then, by means of software operating on the CPU 110, the good or bad of the DUT 150 is decided by comparing the bad information stored on the fail information memory 128 and the bad information stored on the fail information memory 130. Software operating on the CPU 110 is an example of a quality deciding section of the present invention.

According to the testing apparatus 100 of the present embodiment, the memory controllers 120 are respectively provided corresponding to the plurality of DUTs 150, waiting time for generating bad address information or bad information is not generated by concurrently generating the bad address information or the bad information for each of the plurality of DUTs 150. Therefore, it is possible to reduce time from a test termination to a writing start of bad address information or bad information in the DUT 150. In this way, it is possible to reduce a testing time when concurrently testing the plurality of DUTs 150 and thus improve a throughput for a test. Moreover, since the memory controller 120 can be constituted according to the type of the DUT 150, a vendor of the testing apparatus 100 can constitute the testing apparatus 100 so that bad address information and bad information are generated according to the type of the DUT 150.

Figure 2:
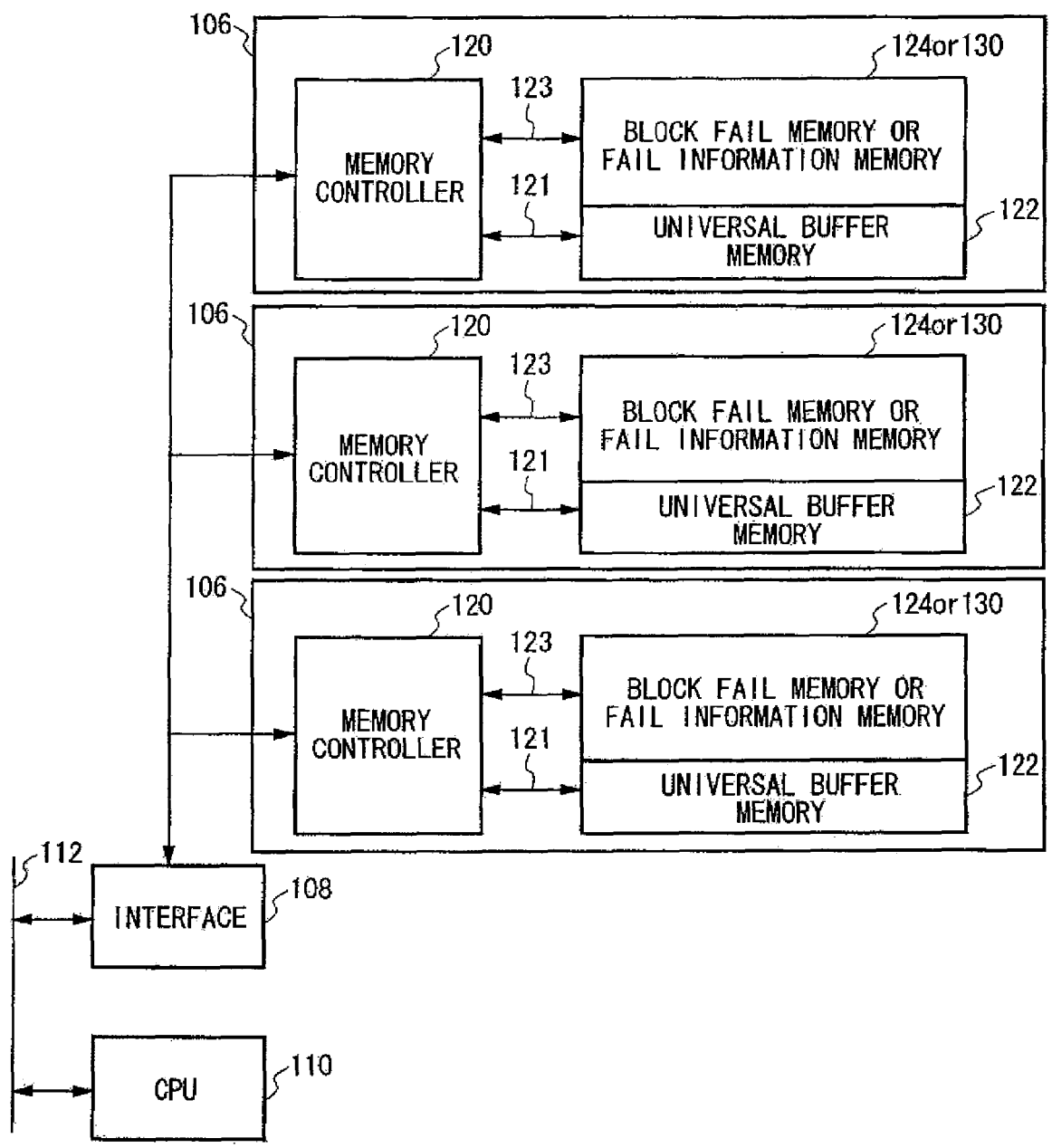
FIG. 2 is a schematic view showing a data transfer process by a testing apparatus 100.

FIG. 2 is a schematic view showing a data transfer process in the testing apparatus 100 according to the present embodiment. Each of the plurality of memory controllers 120 each included in the plurality of individual test units 106 concurrently receives and sends data from and to the universal buffer memory 122, the block fail memory 124, or the fail information memory 130 according to instructions from the CPU 110 by way of the tester bus 112 and the interface 108. Moreover, the plurality of memory controllers 120 concurrently generates bad address information or bad information based on the fail data stored on the universal buffer memory 122 in accordance with a previously loaded program.

The plurality of memory controllers 120 adopts a micro-programming method to flexibly correspond to a series of data processes. Moreover, each of the plurality of memory controllers 120 has bus structure in which the plurality of memory controllers 120 is respectively connected to the universal buffer memories 122 provided corresponding to the controllers through the external buses 121 and is respectively connected to the block fail memories 124 and the fail information memories 130 provided corresponding to the controllers through the internal buses 123.

In this manner, since each of the plurality of memory controllers 120 can be connected to the universal buffer memory 122 or the block fail memory 124 and the fail information memory 130 through a bus different from each other and thus concurrently perform data transfer, it is possible to process at high speed data transfer between the universal buffer memory 122 and the memory controller 120 and data transfer between the memory controller 120 and the block fail memory 124 or the fail information memory 130.

Figure 3:
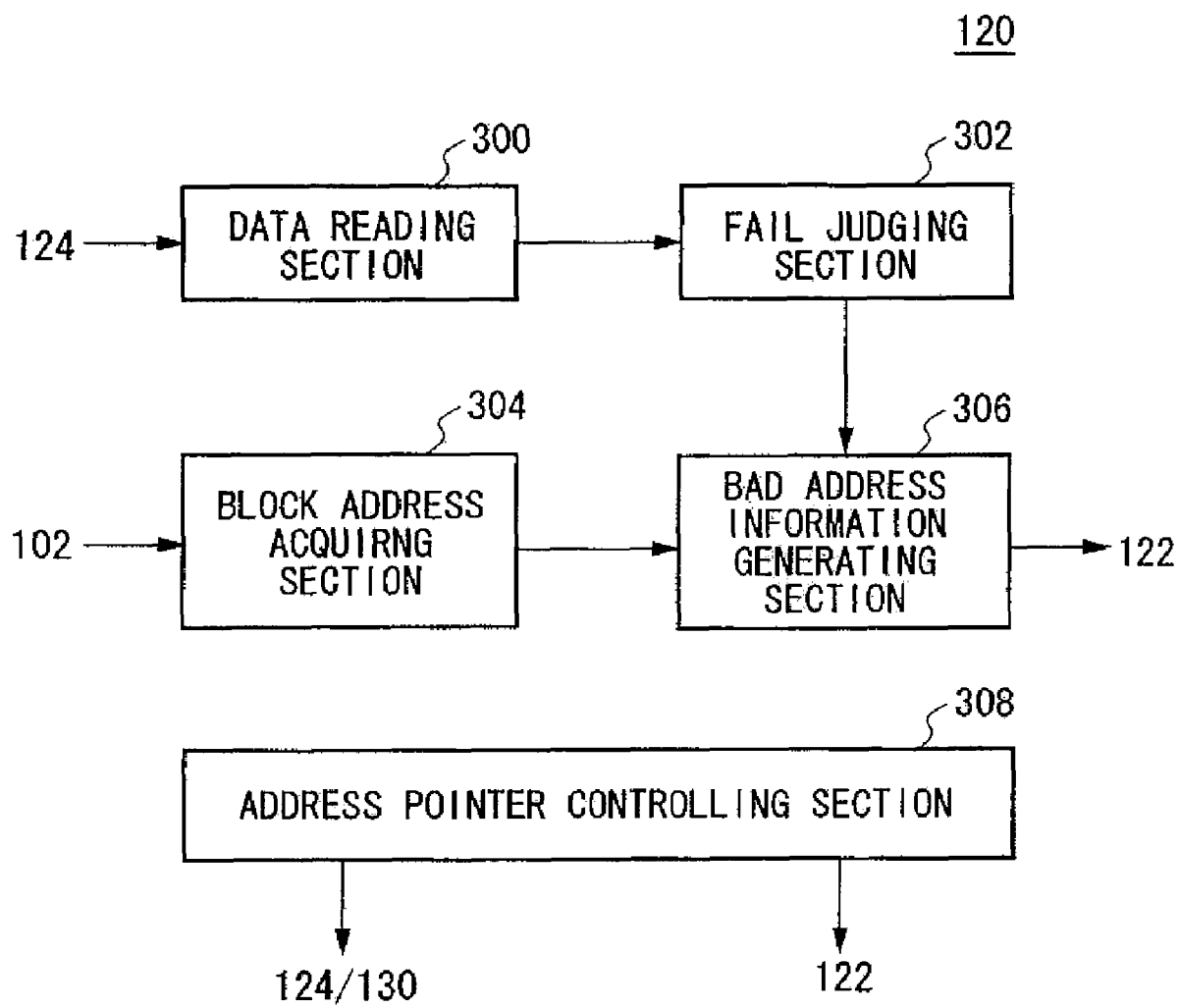
FIG. 3 is a view exemplary showing a functional configuration of a memory controller 120.

FIG. 3 is a view exemplary showing a functional configuration of the memory controller 120 according to the present embodiment. The memory controller 120 has a data reading section 300, a fail judging section 302, a block address acquiring section 304, a bad address information generating section 306, and an address pointer controlling section 308.

The data reading section 300 reads data stored on a predetermined address of the block fail memory 124 because the predetermined address is supplied from the memory controller 120 to the block fail memory 124. The block fail memory 124 stores one-bit data for each block area of the DUT 150. Specifically, the block fail memory 124 stores fail data with a logical value of one in association with a block area when the block area is bad, and stores data with a logical value of zero in association with a block area when the block area is not bad. Then, the data reading section 300 reads at a time data with plural bits stored on the predetermined address in the block fail memory 124, that is, data for the plurality of block areas. Then, the fail judging section 302 judges whether fail data with a logical value of one is included in data with plural bits read from the data reading section 300.

The block address acquiring section 304 acquires a block address of a block area corresponding to data with plural bits read from the block fail memory 124. Then, when the fail judging section 302 judges that fail data is included in data read from the data reading section 300, the bad address information generating section 306 generates bad address information based on a block address of a block area corresponding to fail data among the block addresses acquired by the block address acquiring section 304. Then, the bad address information generating section 306 supplies the generated bad address information to the universal buffer memory 122, and makes the universal buffer memory 122 store it.

Moreover, the bad address information generating section 306 generates bad information including the plurality of bad address information generated based on the plurality of block addresses. Then, the bad address information generating section 306 supplies the generated bad information to the universal buffer memory 122 and the fail information memory 130. Moreover, the address pointer controlling section 308 supplies an address to the universal buffer memory 122, the block fail memory 124, or the fail information memory 130 while incrementing an address pointer.

According to the testing apparatus 100 of the present embodiment, since the memory controllers 120 having a function as described above are provided corresponding to the plurality of DUTs 150, it is possible to concurrently generate bad address information and bad information for the DUT 150. Therefore, since waiting time for making bad address information and bad information is not generated, it is possible to improve a throughput for a test.

Figures 4A, 4B:
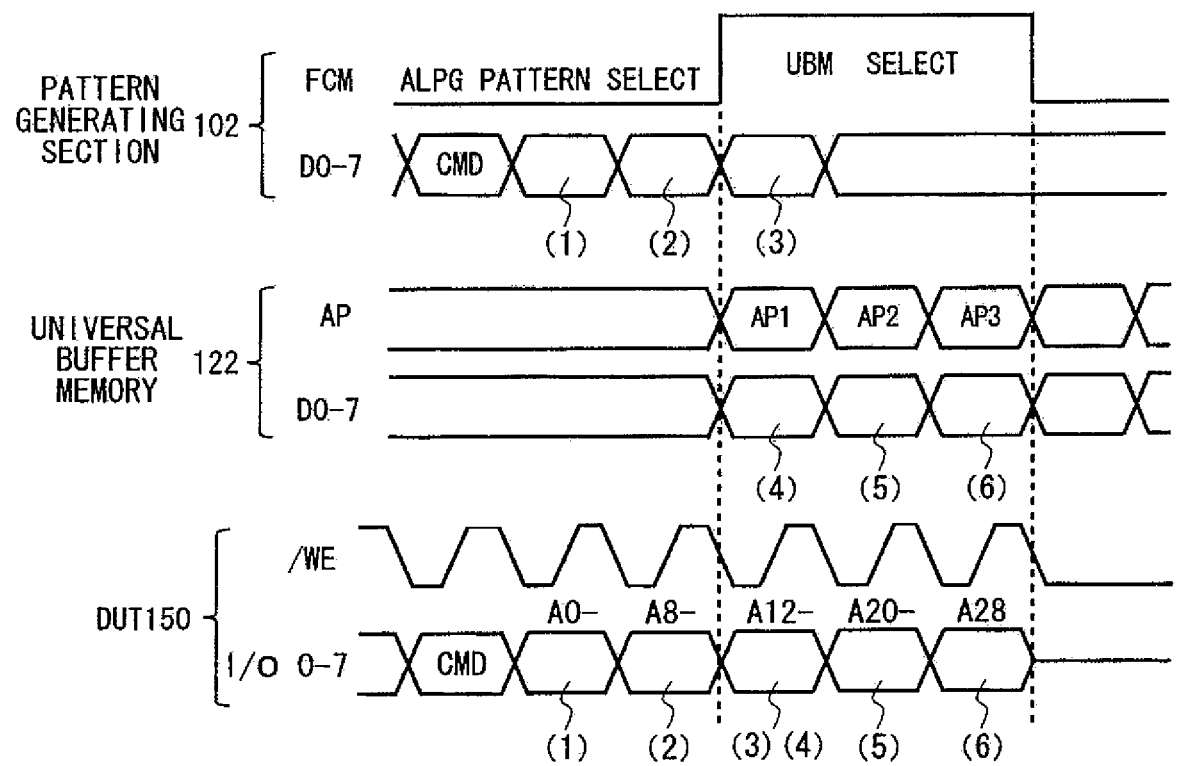
FIG. 4A is a view exemplary showing a data structure of an address signal to be supplied to a DUT 150.
FIG. 4B is a view showing a data structure of an input/output signal to/from a sub waveform shaper 132.

FIG. 4A is a view exemplary showing a configuration of an address signal to be supplied from the testing apparatus 100 to the DUT 150 according to the present embodiment. FIG. 4B is a view showing a data structure of an input/output signal of the sub waveform shaper 132 according to the present embodiment.

For example, when writing data in the DUT 150, as shown in FIG. 4A, it is necessary to be accessed by an address signal of which a column address is held in data of a first cycle and a second cycle and a low address is held in data of a third cycle, a fourth cycle, and a fifth cycle. Then, data of six bits (A12, A13, A14, A15, A16, A17) showing a page address is included in data of the third cycle, and data of 11 bits (A18, A19, A20, A21, A22, A23, A24, A25, A26, A27, A28) showing a block address is included in data of the third cycle, the fourth cycle, and the fifth cycle. For that purpose, the sub waveform shaper 132 combines a page address supplied from the pattern generator 102 and a block address shown by bad address information supplied from the universal buffer memory 122, in order to generate an address signal peculiar to the DUT 150 as shown in FIG. 4A.

As shown in FIG. 4B, the pattern generator 102 outputs an FCM signal showing which is selected between an address signal showing a page address supplied from the pattern generator 102 and a bad address signal showing a block address supplied from the universal buffer memory 122, and supplies the FCM signal to the sub waveform shaper 132. Moreover, the pattern generator 102 outputs instruction data (CMD), data(1) including A0 to A7, data(2) including A8 to A11, and data(3) including A12 to A17, and supplies these data to the sub waveform shaper 132. Moreover, the universal buffer memory 122 outputs data(4) including A18 and A19, data(5) including A20 to A27, and data(6) including A28, which are designated by each of address pointers (AP1, AP2, AP3), and supplies these data to the sub waveform shaper 132.

The sub waveform shaper 132 generates an address signal with a configuration shown in FIG. 4A based on data (1) (2), and (3) supplied from the pattern generator 102 and data (4) (5), and (6) supplied from the universal buffer memory 122 based on the FCM signal supplied from the pattern generator 102. That is to say, assuming that instruction data, data(1), and data(2) supplied from the pattern generator 102 are respectively data of the first cycle, the second cycle, and the third cycle, data including A12 to A17 included in data(3) supplied from the pattern generator 102 and A18 and A19 included in data(4) supplied from the universal buffer memory 122 are data of the fourth cycle, and data(5) and data(6) supplied from the universal buffer memory 122 are respectively data of the fifth cycle and the sixth cycle, the sub waveform shaper 132 supplies these data along with a write enable signal to the DUT 150.

As described above, the sub waveform shaper acquires address data corresponding to a block address from the universal buffer memory 122 and acquires address data corresponding to a page address from the pattern generator 102, in order to synthesize these data and generate an address signal to be supplied to the DUT 150. In this way, the plurality of sub waveform shapers 132 provided corresponding to each of the plurality of DUTs 150 can concurrently write bad information in a common page area of a block area different from one another for the plurality of DUTs 150 by switching a common page address supplied from the pattern generator 102 and a block address different from one another for each of the DUTs 150 in real time. Moreover, since the universal buffer memory 122 stores only a block address for each of the DUTs 150 without storing a page address, it is possible to largely save memory capacity.

Figure 5:
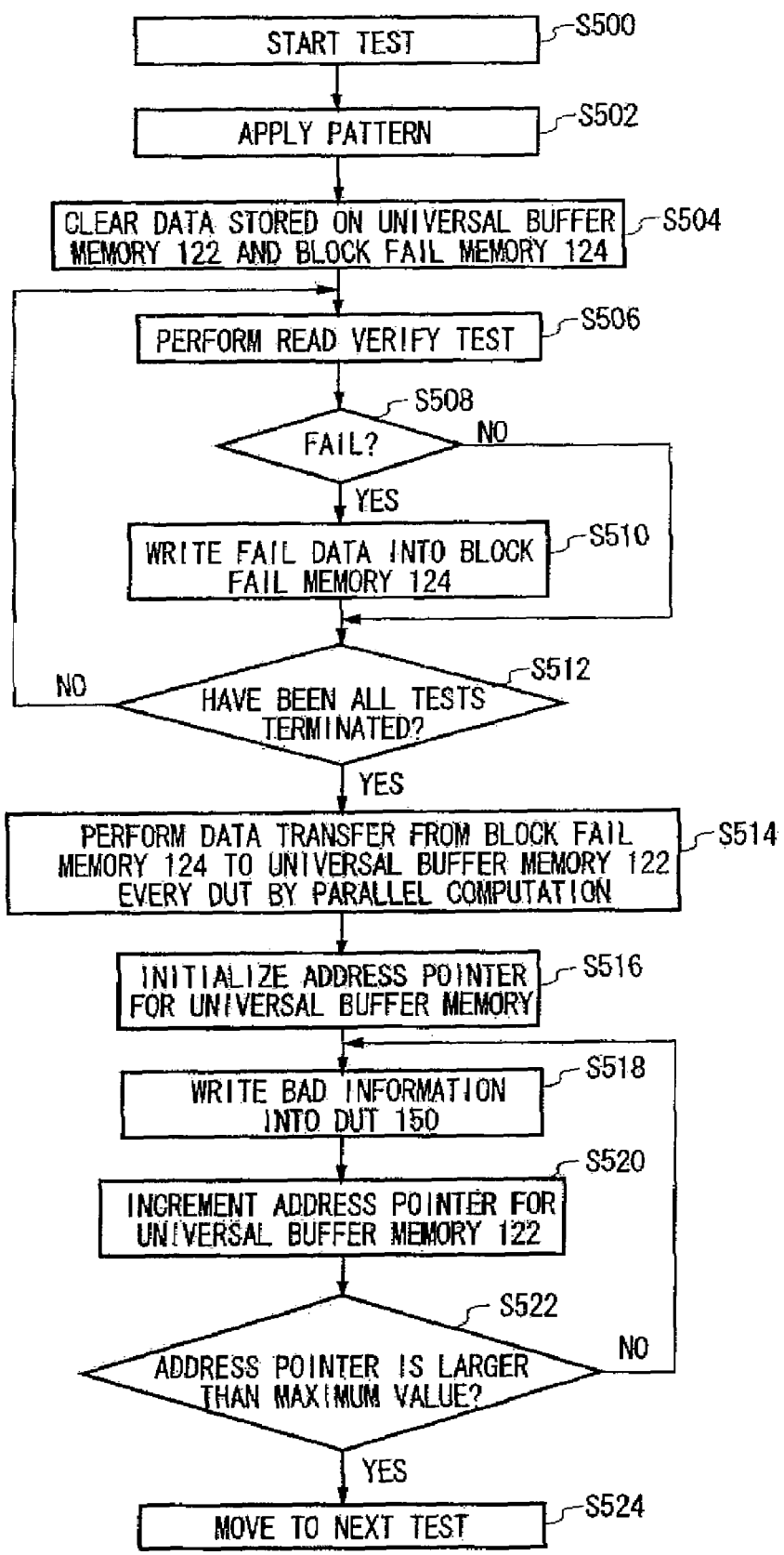
FIG. 5 is a view exemplary showing a flow of a testing method by a test apparatus 100.

FIG. 5 is a view exemplary showing a flow of a testing method by the testing apparatus 100 according to the present embodiment. In FIG. 5, it will be particularly explained about a flow when a test result for a read verifying test is written in an extended area of the DUT 150.

If the present test is started (S500), the pattern generator 102 first applies a pattern to the DUT 150 to set an environment for the DUT 150 (S502). Moreover, data stored on the universal buffer memory 122 and the block fail memory 124 are cleared (S504). Then, the logic comparator 134 compares output data output from the DUT 150 corresponding to an address signal and a data signal generated from the pattern generator 102 with an expectation signal generated from the pattern generator 102, in order to perform a read verifying test (S506). Then, when the output signal and the expectation signal are identical with each other in the read verifying test, the process advances to S512 (S508-NO). On the other hand, when the output signal and the expectation signal are not identical with each other, the logic comparator 134 outputs fail data to supply it to the block fail memory 124 (S508-YES). When fail data are output from the logic comparator 134, the block fail memory 124 writes the fail data in each block area that is an object to be tested in real time (S510). Then, when tests for all block areas of the DUT 150 are terminated (S512-YES), the process advances to S514. On the other hand, when tests for all block areas of the DUT 150 are not terminated (S512-NO), the process returns to S506, and then the processes from S506 to S512 are repeated until tests for all block areas of the DUT 150 are terminated.

Next, each of the plurality of memory controllers 120 performs data transfer from the block fail memory 124 to the universal buffer memory 122 for each of the plurality of DUTs 150 by parallel computation (S514). Specifically, the memory controller 120 generates bad address information showing a block address of a block area corresponding to fail data stored on the block fail memory 124, and supplies it to the universal buffer memory 122.

Next, after initializing an address pointer for the universal buffer memory 122 (S516), while reading bad address information stored on the universal buffer memory 122, bad information is written in an extended area or a special area in a block area shown by the read bad address information (S518), and the address pointer controlling section 308 increments the address pointer for the universal buffer memory 122 (S520). Then, when the address pointer is larger than a predetermined maximum value (S522-YES), the present test is terminated and then the next test is started (S524). On the other hand, when the address pointer is less than or equal to the predetermined maximum value (S522-NO), the process returns to S518 and the processes from S518 to S522 are repeated until the address pointer is larger than the predetermined maximum value.

Figure 6:
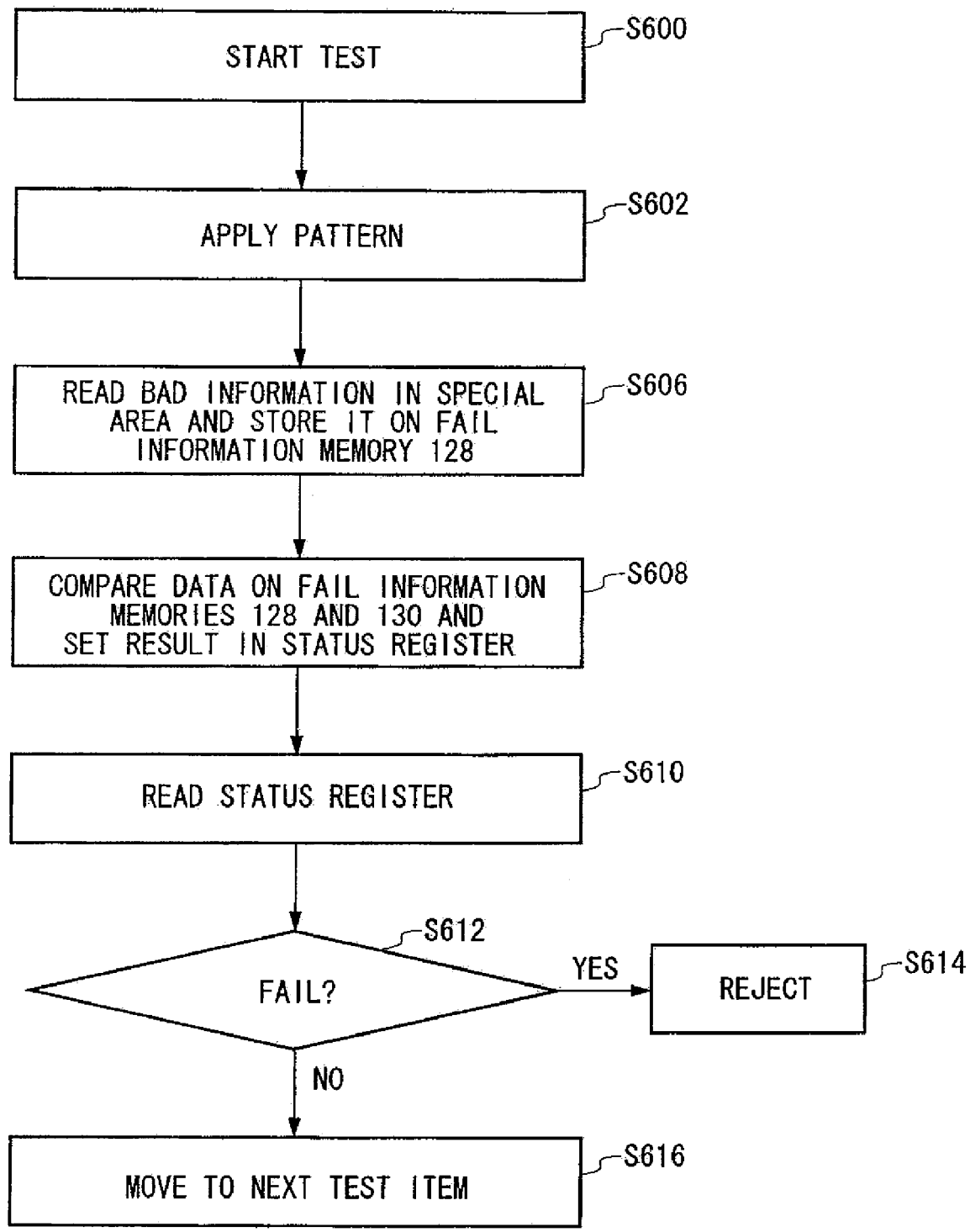
FIG. 6 is a view exemplary showing a flow of a testing method by a test apparatus 100.
Figure 7:
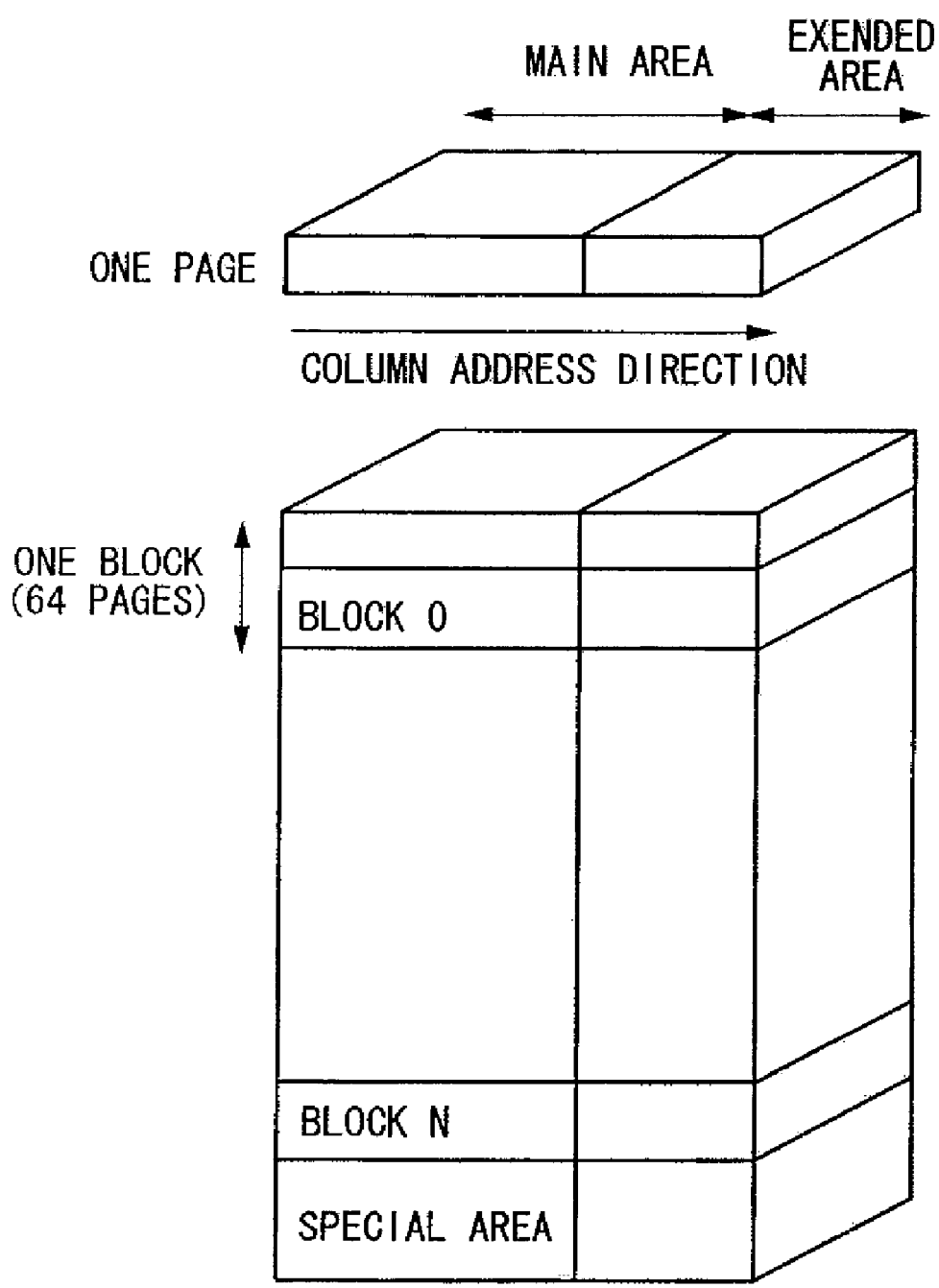
FIG. 7 is a view showing a configuration of a NAND type flash memory.
Figure 8:
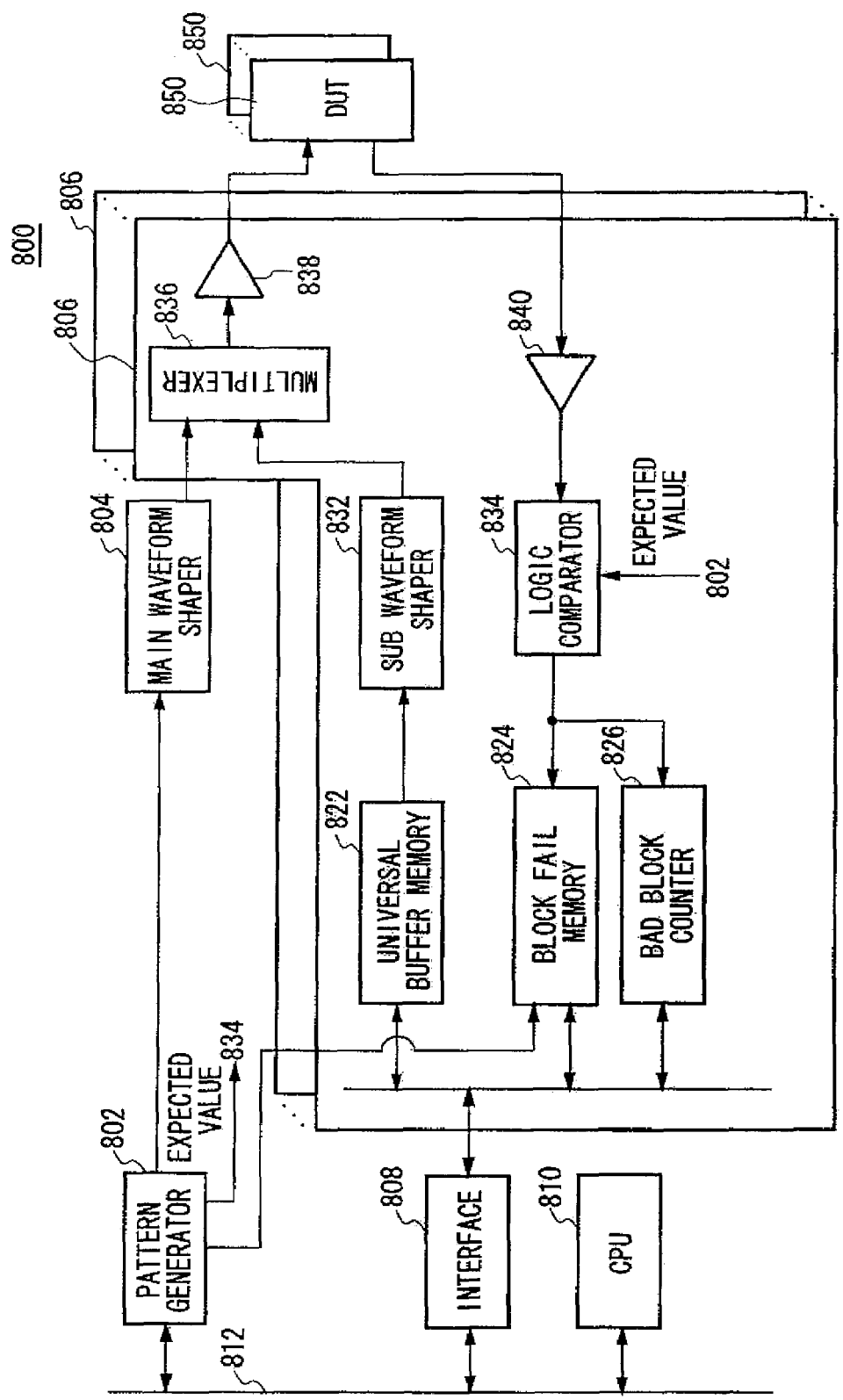
FIG. 8 is a view showing a configuration of a testing apparatus 800 according to a conventional art.

FIG. 6 is a view exemplary showing a flow of a testing method by the testing apparatus 100 according to the present embodiment. In FIG. 6, it will be explained about a flow for a test item for testing whether bad information is appropriately written in a special area particularly.

If the present test is started (S600), the pattern generator 102 first applies a pattern to the DUT 150 to set an environment for the DUT 150 (S602). Then, bad information written in a special area of the DUT 150 by the memory controller 120 in a previous test is read, and is stored on the fail information memory 128 (S606). Then, bad information stored on the fail information memory 130, in which bad information equal to bad information written in a special area of the DUT 150 is written by the memory controller 120 in a previous test, is compared with bad information stored on the fail information memory 128 that stores bad information read from the DUT 150, and a comparison result is set in a status register (S608). In S608, the plurality of memory controllers 120 provided corresponding to each of the plurality of DUTs 150 performs parallel computation for each of the DUTs 150.

Next, the comparison result set in the status register is read (S610), and it is decided whether two bad information is identical with each other, that is, whether the comparison result is a fail (S612). Then, when the comparison result is a fail (S612-YES), it is judged that the DUT 150 of an object to be tested is bad and the DUT is rejected (S614). On the other hand, when the comparison result is not a fail (S612-NO), the process moves to the next test item (S616).

According to the testing apparatus 100 of the present embodiment, since the memory controllers 120 performing data transfer and data conversion between the block fail memory 124 and the universal buffer memory 122 and between the universal buffer memory 122 and the fail information memory 130 are respectively provided corresponding to the plurality of DUTs 150, a processing time for data transfer and data conversion can be largely reduced. As a result, when simultaneously testing a lot of DUTs 150, a throughput for a test is improved and manufacturing yield is further improved, and thus a unit price of a memory can be reduced.

Although the present invention has been described by way of an exemplary embodiment, it should be understood that those skilled in the art might make many changes and substitutions without departing from the spirit and the scope of the present invention. It is obvious from the definition of the appended claims that embodiments with such modifications also belong to the scope of the present invention.

As apparent from the above descriptions, according to the present invention, it is possible to improve a throughput for a test even though a lot of memories under test are simultaneously tested.

What is claimed is:

1. A testing apparatus that concurrently tests a plurality of memories under test, comprising:
   a pattern generator that generates an address signal and a data signal to be supplied to each of the plurality of memories under test and an expectation signal to be output from each memory under test according to the address signal and the data signal;
   a plurality of logic comparators, each of which being provided corresponding to one of the memories under test and comparing an output signal output from the corresponding memory under test according to the address signal and the data signal with the expectation signal to generate fail data when the output signal is not identical with the expectation signal;
   a plurality of fail memories, each of which being provided corresponding to one of the memories under test and storing the fail data generated by the corresponding logic comparator in association with an address shown by the address signal;
   a plurality of memory controllers, each of which being provided corresponding to one of the memories under test and generating bad address information showing a bad address in the corresponding memory under test based on the fail data stored on the corresponding fail memory;
   a plurality of universal buffer memories, each of which being provided corresponding to one of the memories under test and storing the bad address information generated from the corresponding memory controller; and
   a plurality of bad information writing sections, each of which being provided corresponding to one of the memories under test and writing first bad information into the bad address in the corresponding memory under test, the bad address being shown by the bad address information stored on the corresponding universal buffer memory, the writing first bad information being performed concurrently for the plurality of memories under test.

2. The testing apparatus as claimed in claim 1, further comprising: a plurality of first buses that respectively connect the plurality of fail memories to the plurality of memory controllers; and a plurality of second buses that respectively connect the plurality of memory controllers to the plurality of universal buffer memories.

3. The testing apparatus as claimed in claim 1, wherein each of the memory controllers generates the bad address information with a format peculiar to the corresponding memory under test and supplies the generated information to the corresponding universal buffer memory.

4. The testing apparatus as claimed in claim 3, wherein each of the memory controllers operates based on a program loaded according to a type of the corresponding memory under test in order to generate the bad address information with the format peculiar to the corresponding memory under test.

5. The testing apparatus as claimed in claim 1, wherein each memory under test comprises a plurality of block areas each having a plurality of page areas, each page area including a main area storing data and an extended area storing the first bad information,
   each fail memory stores the fail data on each of the block areas in the corresponding memory under test,
   each memory controller generates the bad address information showing a block address of a defective of the block areas in the corresponding memory under test with reference to the corresponding fail memory,
   each universal buffer memory stores the bad address information generated from the corresponding memory controller, and
   each bad information writing section writes first bad information into the extended area in the block area shown by the bad address information stored on the corresponding universal buffer memory.

6. The testing apparatus as claimed in claim 5, wherein the pattern generator generates a page address signal showing the page area to supply the generated signal to the plurality of bad information writing sections, and the plurality of bad information writing sections write the first bad information into the extended area in the page area shown by the page address signal generated from the pattern generator.

7. The testing apparatus as claimed in claim 1, wherein each memory controller comprises:
   a data reading section that reads data stored on a predetermined address of the corresponding fail memory;
   a fail judging section that judges whether or not the fail data are included in the data read by the data reading section; and
   a bad address information generating section that generates the bad address information when the fail judging section judges that the fail data are included in the data read by the data reading section.

8. The testing apparatus as claimed in claim 1, wherein each memory controller generates second bad information with a format peculiar to the corresponding memory under test based on the fail data stored on the corresponding fail memory,
   each universal buffer memory stores the second bad information generated by the corresponding memory controller, and
   each bad information writing section writes the second bad information stored on the corresponding universal buffer memory into the plurality of memories under test into the corresponding memory under test.

9. The testing apparatus as claimed in claim 8, wherein each memory controller operates based on a program loaded according to a type of the corresponding memory under test in order to generate the second bad information with the format peculiar to the corresponding memory under test.

10. The testing apparatus as claimed in claim 8, further comprising:
    a plurality of first fail information memories, each of which being provided corresponding to one of the memories under test and storing the second bad information generated by the corresponding memory controller;

a plurality of second fail information memories, each of which being provided corresponding to one of the memories under test and storing the second bad information read from the corresponding memory under test; and a quality deciding section that compares each second bad information stored on each first fail information memory with each second bad information stored on the corresponding second fail information memory to decide whether each memory under test is defective.

11. The testing apparatus as claimed in claim 10, further comprising:

a plurality of first buses that respectively connect the plurality of fail memories and the plurality of first fail information memories to the plurality of memory controllers; and a plurality of second buses that respectively connect the plurality of memory controllers to the plurality of universal buffer memories.

12. The testing apparatus as claimed in claim 11, wherein each memory under test comprises a plurality of main areas storing data and a special area storing the second bad information, and each bad information writing section writes the second bad information into the special area included in the corresponding memory under test.

13. A testing apparatus that concurrently tests a plurality of memories under test, comprising:

a pattern generator that generates an address signal and a data signal to be supplied to each of the plurality of memories under test and an expectation signal to be output from each memory under test according to the address signal and the data signal;

a plurality of logic comparators, each of which being provided corresponding to one of the memories under test and comparing an output signal output from the corresponding memory under test according to the address signal and the data signal and the expectation signal to generate fail data when the output signal is not identical with the expectation signal;

a plurality of fail memories, each of which being provided corresponding to one of the memories under test and storing the fail data generated by the corresponding logical comparator in association with an address shown by the address signal;

a plurality of memory controllers, each of which being provided corresponding to one of the memories under test and generating bad information with a format peculiar to each memory under test based on the fail data stored on the corresponding fail memory;

a plurality of universal buffer memories, each of which being provided corresponding to one of the memories under test and storing the bad information generated from the corresponding memory controller; and a plurality of bad information writing sections, each of which being provided corresponding to one of the memories under test and writing the bad information stored on the corresponding universal buffer memory, the writing the bad information being performed concurrently for the plurality of memories under test.

14. A testing method for concurrently testing a plurality of memories under test, comprising:

generating an address signal and a data signal to be supplied to each of the plurality of memories under test and an expectation signal to be output from each memory under test according to the address signal and the data signal;

comparing an output signal output from each memory under test according to the address signal and the data signal with the expectation signal to generate fail data when the output signal is not identical with the expectation signal by means of a plurality of logic comparators, each of which is provided corresponding to one of the memories under test;

storing the fail data in association with an address shown by the address signal on a plurality of fail memories, each of which is provided corresponding to one of the memories under test;

generating bad address information showing a bad address in each memory under test based on the fail data stored on the corresponding fail memory by means of a plurality of memory controllers, each of which is provided corresponding to one of the memories under test;

storing the bad address information generated by each memory controller on a plurality of universal buffer memories, each of which is provided corresponding to one of the memories under test; and writing a first bad information into the bad address in each memory under test, the bad address being shown by the bad address information stored on the corresponding universal buffer memory by means of a plurality of bad information writing sections, each of which is provided corresponding to one of the memories under test, the writing the first bad information being performed concurrently for the plurality of memories under test.

15. A testing method for concurrently testing a plurality of memories under test, comprising:

generating an address signal and a data signal to be supplied to each of the plurality of memories under test and an expectation signal to be output from each memory under test according to the address signal and the data signal;

comparing an output signal output from each memory under test according to the address signal and the data signal with the expectation signal to generate fail data when the output signal is not identical with the expectation signal by means of a plurality of logic comparators, each of which is provided corresponding to one of the memories under test;

storing the fail data generated by each logic comparator in association with an address shown by the address signal by means of a plurality of fail memories, each of which is provided corresponding to one of the memories under test;

generating bad information with a format peculiar to each memory under test based on the fail data stored on the corresponding fail memory by means of a plurality of memory controllers, each of which is provided corresponding to one of the memories under test;

storing the bad information generated by each memory controller by means of a plurality of universal buffer memories, each of which is provided corresponding to one of the memories under test; and writing the bad information stored on each universal buffer memory into the corresponding memory under test by means of a plurality of bad information writing sections, each of which is provided corresponding to one of the memories under test, the writing the bad information being performed concurrently for the plurality of memories under test.

* * * * *

UNITED STATES PATENT AND TRADEMARK OFFICE
CERTIFICATE OF CORRECTION

PATENT NO.        : 7,441,166 B2
APPLICATION NO.   : 11/515350
DATED             : October 21, 2008
INVENTOR(S)       : Masuhiro Yamada et al.

Figure 9:
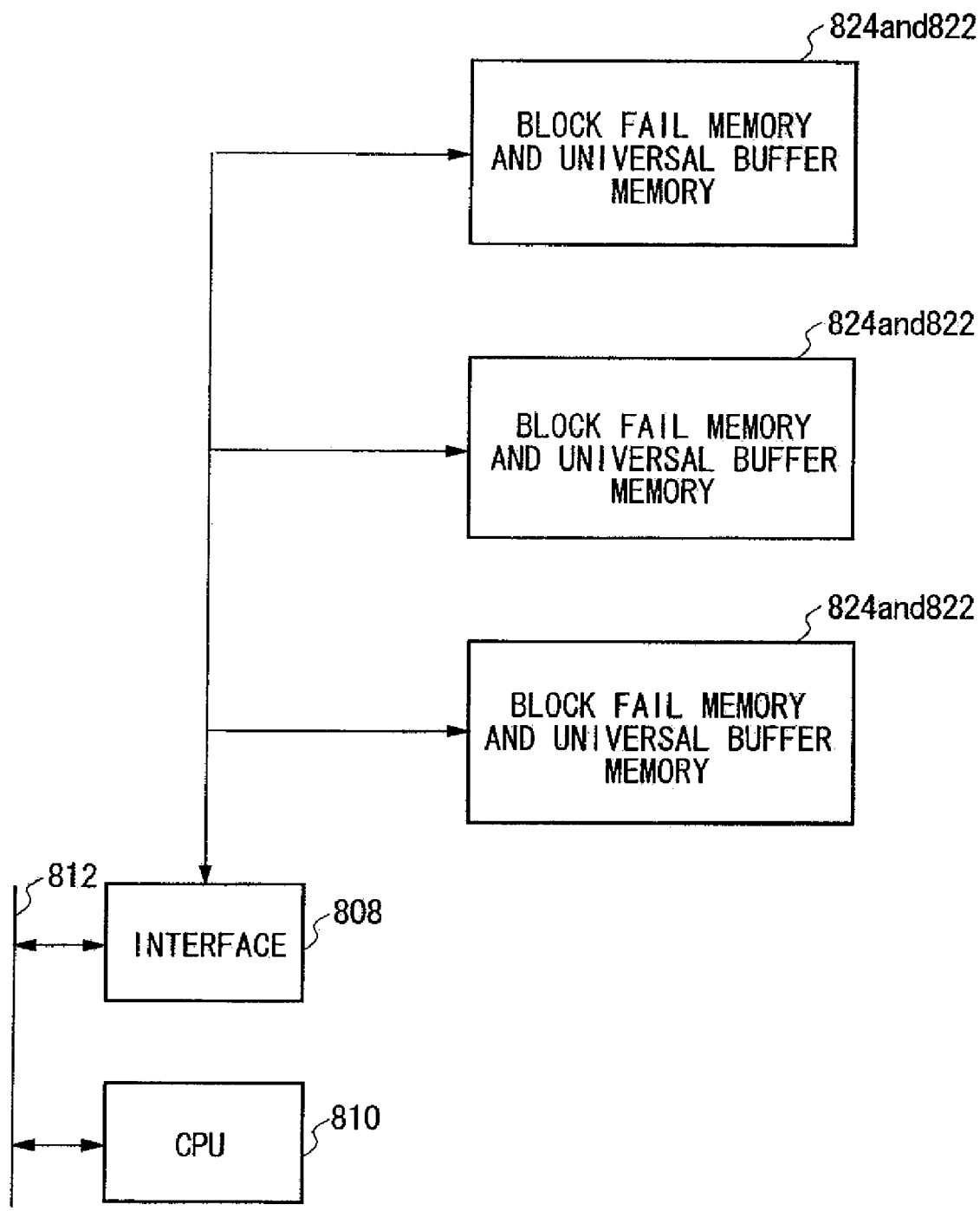
FIG. 9 is a schematic view showing a data transfer process by a testing apparatus 800 according to a conventional art.
Figure 9:
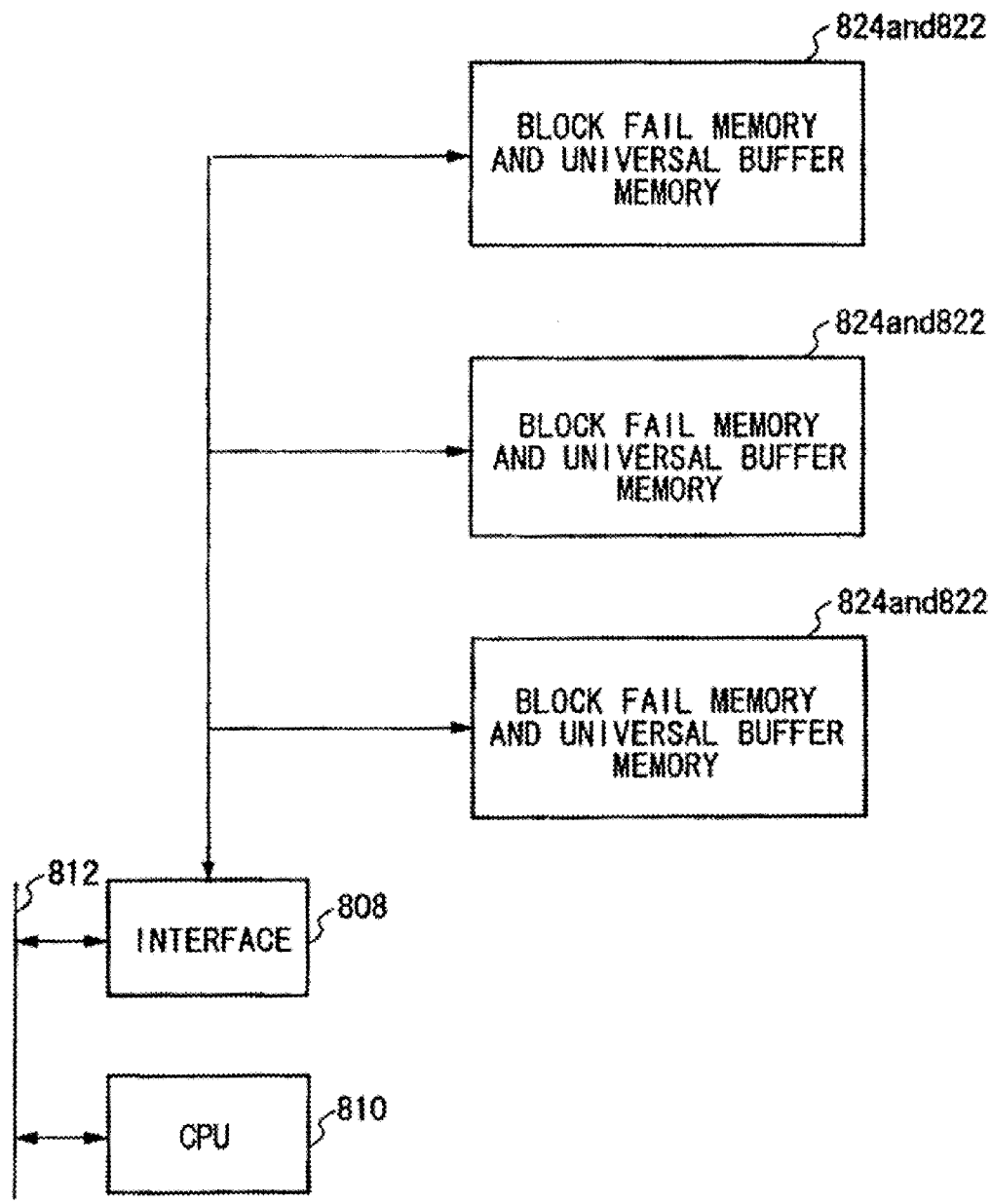

It is certified that error appears in the above-identified patent and that said Letters Patent is hereby corrected as shown below:

In the Drawings:

In the Drawings, Sheet 9 of 9, Figure 9, the words "Prior Art" are erroneously missing. Please substitute the drawing with the replacement drawing enclosed.

Signed and Sealed this

Tenth Day of February, 2009

JOHN DOLL
*Acting Director of the United States Patent and Trademark Office*